United States Patent
Killpack

(10) Patent No.: US 10,708,412 B1
(45) Date of Patent: Jul. 7, 2020

(54) TRANSFERRING COMPUTER AIDED DISPATCH INCIDENT DATA BETWEEN PUBLIC SAFETY ANSWERING POINT STATIONS

(71) Applicant: MOTOROLA SOLUTIONS, INC., Chicago, IL (US)

(72) Inventor: Michael Killpack, Salt Lake City, UT (US)

(73) Assignee: MOTOROLA SOLUTIONS, INC., Chicago, IL (US)

(*) Notice: Subject to any disclaimer, the term of this patent is extended or adjusted under 35 U.S.C. 154(b) by 0 days.

(21) Appl. No.: 16/557,345

(22) Filed: Aug. 30, 2019

(51) Int. Cl.
| | |
|---|---|
| *H04M 11/04* | (2006.01) |
| *H04M 1/725* | (2006.01) |
| *H04M 3/51* | (2006.01) |
| *H04W 4/90* | (2018.01) |
| *H04L 1/16* | (2006.01) |
| *H04W 76/50* | (2018.01) |
| *G06F 30/18* | (2020.01) |

(52) U.S. Cl.
CPC ........ *H04M 1/72541* (2013.01); *G06F 30/18* (2020.01); *H04L 1/1657* (2013.01); *H04M 3/5116* (2013.01); *H04M 11/04* (2013.01); *H04W 4/90* (2018.02); *H04W 76/50* (2018.02)

(58) Field of Classification Search
CPC ..... H04W 76/007; H04W 4/22; H04W 64/00; H04W 36/30; H04W 36/18; H04W 36/08; H04W 36/32; H04W 36/0083; H04M 11/04; H04M 2242/04

USPC .................................. 455/404.1, 404.2, 436
See application file for complete search history.

(56) References Cited

U.S. PATENT DOCUMENTS

| | | |
|---|---|---|
| 5,311,569 A | 5/1994 | Brozovich et al. |
| 9,060,076 B2 | 6/2015 | Breen et al. |
| 9,509,842 B2 | 11/2016 | Estrada et al. |
| 2013/0077766 A1 | 3/2013 | Keller et al. |
| 2014/0192964 A1 | 7/2014 | Bhogal et al. |
| 2015/0170507 A1* | 6/2015 | Ginter .................. G08B 27/005 340/539.18 |

* cited by examiner

*Primary Examiner* — Temica M Beamer
(74) *Attorney, Agent, or Firm* — Michael Best & Friedrich LLP

(57) ABSTRACT

Systems, methods, and non-transitory computer-readable mediums for transferring computer aided dispatch (CAD) incident data between public safety answering point (PSAP) station computing devices as a result of a detected successful call transfer at an emergency call handling (ECH) server. In one example, a first PSAP station computing device is configured to receive a call from the ECH server, CAD incident data associated with the call, and a request to transfer the call. The first PSAP station computing device is also configured to send a request to the ECH server to transfer the call. The first PSAP station computing device is also configured to receive an acknowledgement from the ECH server of a successful call transfer. The first PSAP station computing device is also configured to send a request to a message queue to provide the CAD incident data to the PSAP station computing device that received the transferred call.

19 Claims, 6 Drawing Sheets

TRANSFERRING COMPUTER AIDED DISPATCH INCIDENT DATA BETWEEN PUBLIC SAFETY ANSWERING POINT STATIONS

BACKGROUND OF THE INVENTION

A user at a public safety answering point (PSAP) may act as a call taker using a cloud-based emergency call handling (ECH) application to handle emergency calls. The user may also act as a dispatcher by entering computer aided dispatch (CAD) incident data to create new CAD incidents for emergency calls. When the user needs to transfer an emergency call to another user, the cloud-based ECH application handles transferring the emergency call automatically.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
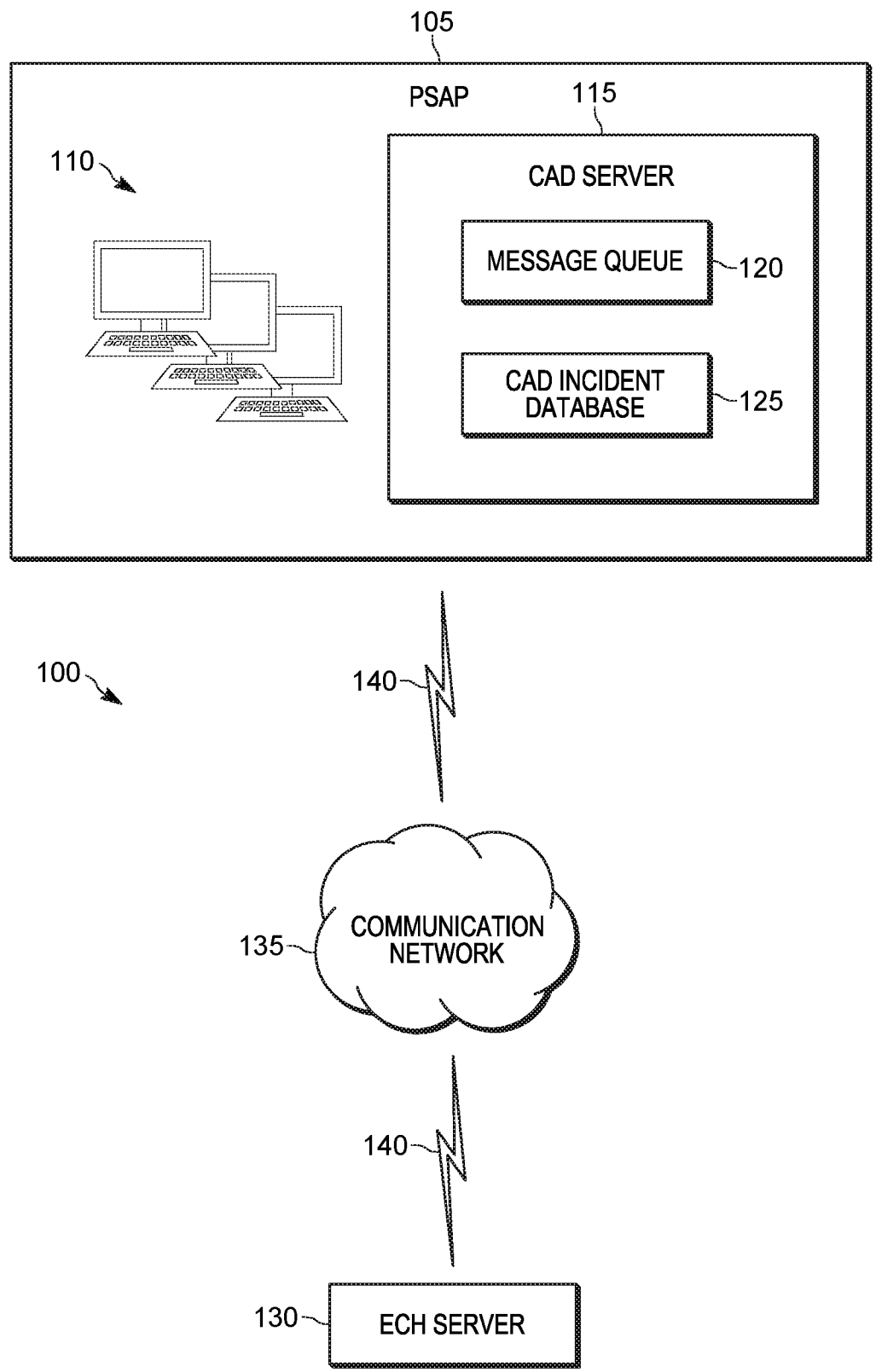
FIG. 1 is a block diagram of an example of a communication system, in accordance with some embodiments.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

As described above, a cloud-based emergency call handling (ECH) application handles transferring emergency calls between users at a public safety answering point (PSAP) automatically. However, the cloud-based ECH application is not able to transfer corresponding computer aided dispatch (CAD) incident data along with emergency calls. Thus, when a first user at a PSAP transfers an emergency call to a second user at the PSAP, the first user needs to save the corresponding CAD incident data in an on-premises CAD database. Upon accepting the transferred emergency call, the second user must manually locate the CAD incident data in the CAD database. Accordingly, embodiments disclosed herein provide, among other things, a system, method, and non-transitory computer readable medium for automatically transferring CAD incident data between PSAP stations as a result of a detected successful call transfer.

One embodiment provides a system for transferring CAD incident data between PSAP station computing devices as a result of a detected successful call transfer at a cloud-based ECH server. In one example, the system includes a CAD server and a plurality of PSAP station computing devices. The CAD server and the plurality of PSAP station computing devices are all located at a PSAP. The plurality of PSAP station computing devices includes at least a first PSAP station computing device and a second PSAP station computing device. The first PSAP station computing device is configured to send, to the cloud-based ECH server, a first identifier that identifies a first PSAP position of the first PSAP station computing device at the PSAP. The first PSAP station computing device is also configured to receive an emergency call from the cloud-based ECH server. The first PSAP station computing device is also configured to receive user-entered CAD incident data associated with the emergency call from a first user at the first PSAP station computing device. The first PSAP station computing device is also configured to receive a user-entered request to transfer the emergency call to the second PSAP station computing device. The first PSAP station computing device is also configured to send, to the cloud-based ECH server, a first request to transfer the emergency call to the second PSAP station computing device. The first request includes a second identifier that identifies a second PSAP position of the second PSAP station computing device at the PSAP. The first PSAP station computing device is also configured to receive, from the cloud-based ECH server, an acknowledgement of a successful transfer of the emergency call to the second PSAP station computing device. The first PSAP station computing device is also configured to send, to a message queue at the CAD server, a second request to provide the user-entered CAD incident data to the second PSAP station computing device. The second request includes the second identifier.

Another embodiment provides a method for transferring CAD incident data between PSAP station computing devices as a result of a detected successful call transfer at a cloud-based ECH server. The method includes sending, to the cloud-based ECH server from a first PSAP station computing device located at a PSAP, a first identifier that identifies a first PSAP position of the first PSAP station computing device at the PSAP. The method also includes receiving an emergency call at the first PSAP station computing device from the cloud-based ECH server. The method also includes receiving user-entered CAD incident data associated with the emergency call at the first PSAP station computing device from a first user. The method also includes receiving, at the first PSAP station computing device, a user-entered request to transfer the emergency call to a second PSAP station computing device located at the PSAP. The method also includes sending, to the cloud-based ECH server from the first PSAP station computing device, a first request to transfer the emergency call to the second PSAP station computing device. The first request includes a second identifier that identifies a second PSAP position of the second PSAP station computing device at the PSAP. The method also includes receiving, at the first PSAP station computing device from the cloud-based ECH server, an acknowledgement of a successful transfer of the emergency call to the second PSAP station computing device. The method also includes sending, to a message queue at a CAD server located at the PSAP from the first PSAP station computing device, a second request to provide the user-entered CAD incident data to the second PSAP station computing device. The second request includes the second identifier.

Another embodiment provides a non-transitory computer-readable medium for use in connection with transferring CAD incident data between PSAP station computing devices as a result of a detected successful call transfer at a cloud-based ECH server. The non-transitory computer-readable medium includes instructions that, when executed by a first PSAP station computing device located at a PSAP, cause the first PSAP station computing device to send, to the cloud-based ECH server, a first identifier that identifies a first PSAP position of the first PSAP station computing device at the PSAP. The instructions also cause the first PSAP station computing device to receive an emergency call from the cloud-based ECH server. The instructions also cause the first PSAP station computing device to receive user-entered CAD incident data associated with the emergency call. The instructions also cause the first PSAP station computing device to receive a user-entered request to transfer the emergency call to a second PSAP station computing device located at the PSAP. The instructions also cause the first PSAP station computing device to send, to the cloud-based ECH server, a first request to transfer the emergency call to the second PSAP station computing device. The first request includes a second identifier that identifies a second PSAP position of the second PSAP station computing device at the PSAP. The instructions also cause the first PSAP station computing device to receive, from the cloud-based ECH server, an acknowledgement of a successful transfer of the emergency call to the second PSAP station computing device. The instructions also cause the first PSAP station computing device to send, to a message queue at a CAD server located at the PSAP, a second request to provide the user-entered CAD incident data to the second PSAP station computing device. The second request includes the second identifier.

FIG. 1 is a block diagram of an example of a communication system 100. FIG. 1 shows one example of a network in which the disclosed systems and methods may be implemented. This example is for illustrative purposes only and the invention may be implemented on other networks. In the example shown, the communication system 100 includes a public safety answering point (i.e., PSAP 105). The PSAP 105 illustrated in FIG. 1 includes a plurality of PSAP station computing devices 110 each operated by a different user. The users of the PSAP station computing devices 110 act as call takers by analyzing communications (for example, voice calls, video calls, text messages, and the like) received from citizens via the PSAP station computing devices 110 (for example, a computer having a screen, voice, video, and text capabilities). In addition, the users of the PSAP station computing devices 110 also act as dispatchers by entering CAD incident data associated with the communications into the PSAP station computing devices 110 to create CAD incidents based on the communications. A CAD incident includes, for example, a public safety incident in which public safety officers are called to a location to provide assistance in resolving or preventing a societal or environmental problem (for example, a location where a suspect is committing or has committed a crime, a fire, a vehicular accident, a traffic stop, and the like). CAD incident data can be provided to responding parties (e.g., police officers, firefighters, emergency medical technicians, and the like) to aid the responding parties in responding to CAD incidents. CAD incident data includes, for example, the location of a CAD incident (e.g., a street address, a street intersection, GPS coordinates, and the like), the type of CAD incident (e.g., a fire, a vehicular accident, a riot, and the like), and other relevant information for a CAD incident (e.g., physical descriptions of suspects, descriptions of injured parties, notifications of armed suspects, etc.).

The PSAP 105 also includes a CAD server 115. The CAD server 115, which will be described in more detail below, includes a message queue 120 and a CAD incident database 125. The PSAP station computing devices 110 and the CAD server 115 are on-premises at the PSAP 105. For example, the PSAP station computing devices 110 and the CAD server 115 are all located in a building that houses the PSAP 105. Each of the PSAP station computing devices 110 is associated with a unique PSAP position at the PSAP 105 that uniquely identifies each of the PSAP station computing devices 110 located at the PSAP 105. For example, a first PSAP station computing device 110A may be associated with a first PSAP position and a second PSAP station computing device 110B may be associated with a second PSAP position.

The communication system 100 illustrated in FIG. 1 also includes an ECH server 130. The ECH server 130 is configured to, among things, handle call transfers between PSAP station computing devices 110. Unlike the PSAP station computing devices 110 and the CAD server 115 which are on-premises at the PSAP 105, the ECH server 130 is cloud-based. For example, the ECH server 130 (an example of a "cloud-based ECH server") may be implemented in a cloud compute cluster that is remotely-disposed from the PSAP 105.

In some embodiments, each of the PSAP station computing devices 110 are configured to execute a converged ECH and CAD application. For example, each of the PSAP station computing devices 110 are configured to execute an on-premises application which communicates with the CAD server 115 and includes an integrated cloud-linked module that communicates with the ECH server 130. In alternate embodiments, each of the PSAP station computing devices 110 are configured to execute separate ECH and CAD applications. For example, each of the PSAP station computing devices 110 are configured to execute an on-premises CAD application that communicates with the CAD server 115 and an ECH web-browser application that communicates with the ECH server 130.

As indicated in FIG. 1, the devices illustrated in FIG. 1 may communicate with each other over a communication network 135 over respective wireless links 140 and via corresponding network interfaces including one or more transceiver circuits (for example, by sending and receiving radio signals). Although depicted in FIG. 1 as communicating with each other over the communication network 135 over respective wireless links 140, one or more of the illustrated components may communicate with each other over the communication network 135 over one or more wired links (not shown). The communication network 135 may include wireless and wired portions. In some embodiments, all or portions of the communication network 135 operate according to an industry standard land mobile radio (LMR) or cellular protocol such as, for example, the Project 25 (P25) standard defined by the Association of Public Safety Communications Officials International (APCO), the TETRA standard defined by the European Telecommunication Standards Institute (ETSI), the Digital Private Mobile Radio (dPMR) standard also defined by the ETSI, the Digital Mobile Radio (DMR) standard also defined by the ETSI, the Long Term Evolution (LTE) (including LTE-Advanced or LTE-Advanced Pro compliant with, for example, the 3GPP TS 36 specification series), or the 5G (including a network architecture compliant with, for example, the 3GPP TS 23 specification series and a new radio (NR) air interface compliant with the 3GPP TS 38 specification series) standard, among other possibilities, and over which multimedia broadcast multicast services (MBMS), single site point-to-multipoint (SC-PTM) services, or Mission Critical Push-to-talk (MCPTT) services may be provided, or over which an open mobile alliance (OMA) push to talk (PTT) over cellular (OMA-PoC), a voice over IP (VoIP), or a PTT over IP (PoIP) application may be implemented. In some embodiments, the communication network 135 includes the Internet, a Bluetooth™ network, a wireless local area network (for example, Wi-Fi), a wireless accessory Personal Area Network (PAN), a Machine-to-machine (M2M) autonomous network, a public switched telephone network, or a combination thereof.

Figure 2:
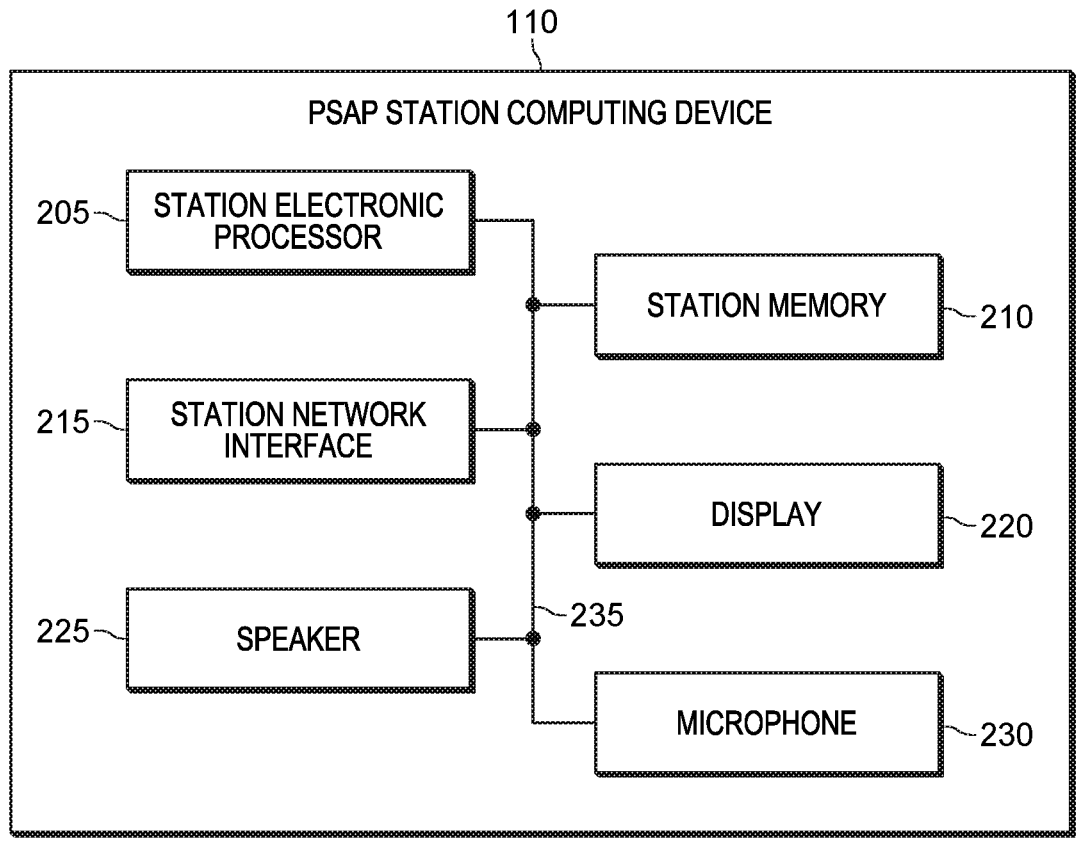
FIG. 2 is a block diagram of an example of an embodiment of a public safety answering point (PSAP) station computing device included in the communication system of FIG. 1.

FIG. 2 is a block diagram of one example of an embodiment of the PSAP station computing device 110. The PSAP station computing device 110 illustrated in FIG. 2 includes a station electronic processor 205 (for example, a microprocessor or other electronic device), station memory 210, a station network interface 215, a display 220, a speaker 225, and a microphone 230. The station electronic processor 205, the station memory 210, the station network interface 215, the display 220, the speaker 225, the microphone 230, as well as other various modules (not shown) are coupled by a station bus 235, or are coupled directly, by one or more additional control or data buses, or a combination thereof. In some embodiments, the PSAP station computing device 110 includes fewer or additional components in configurations different from that illustrated in FIG. 2. For example, the PSAP station computing device 110 may additionally include a camera. As another example, the PSAP station computing device 110 may include one or more additional input devices such as a computer mouse and a keyboard that receive inputs from a user of the PSAP station computing device 110.

The station memory 210 may include read only memory (ROM), random access memory (RAM), other non-transitory computer-readable media, or a combination thereof. The station electronic processor 205 is configured to receive instructions and data from the station memory 210 and execute, among other things, the instructions. In particular, the station electronic processor 205 executes instructions stored in the station memory 210 to perform the methods described herein.

The station network interface 215 sends and receives data to and from the CAD server 115 and the communication network 135. In some embodiments, the station network interface 215 includes one or more transceivers for wirelessly communicating with CAD server 115 and the communication network 135. Alternatively or in addition, the station network interface 215 may include connectors or ports for receiving wired connections to the CAD server 115 and the communication network 135, such as Ethernet cables.

In some embodiments, the display 220 displays images, video, text, data from sensor input, or a combination thereof. The display 220 may be, for example, a liquid crystal display (LCD) screen or an organic light emitting display (OLED) display screen. In some embodiments, a touch-sensitive input interface may be incorporated into the display 220 as well, allowing the user to interact with content provided on the display 220. The speaker 225 converts electrical signal into audible sound. In some embodiments, one or both of the display 220 and the speaker 225 are referred to as an "output interface" of the PSAP station computing device 110 that present data feeds to a user. The microphone 230 converts acoustic waves into electrical signals. In some embodiments, one or more of the microphone 230, a computer mouse, a keyboard, and a touch-sensitive input interface of the display 220 are referred to as an "input interface" of the PSAP station computing device 110 that receive input from the user.

Figure 3:
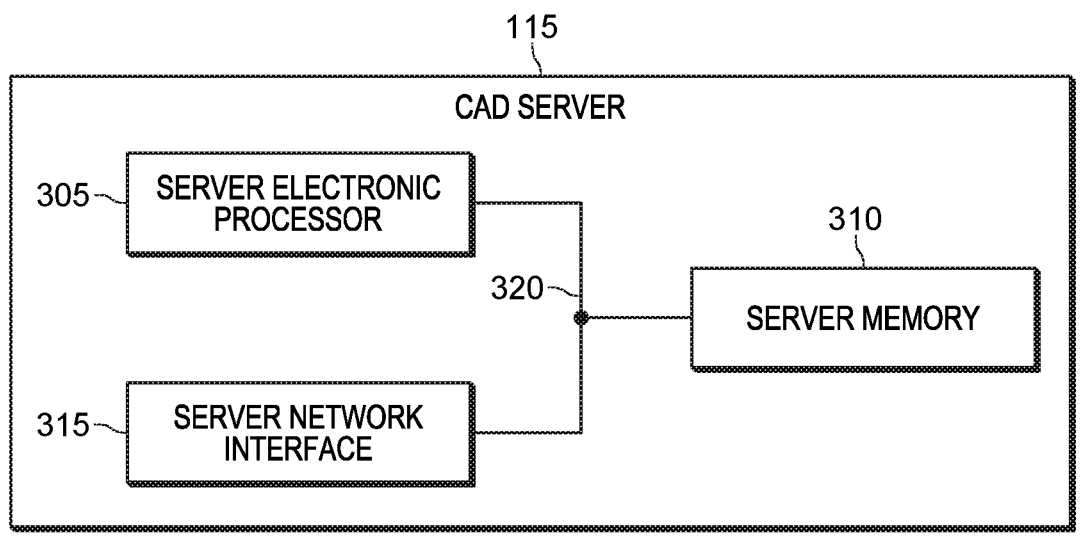
FIG. 3 is a block diagram of an example of an embodiment of a computer aided dispatch (CAD) server included in the communication system of FIG. 1.

FIG. 3 is a block diagram of one example of an embodiment of the CAD server 115. The CAD server 115 illustrated in FIG. 2 includes a server electronic processor 305 (for example, a microprocessor, or other electronic controller), server memory 310, and a server network interface 315. The server electronic processor 305, the server memory 310, the server network interface 315, as well as other various modules (not shown) are coupled by a server bus 320, or are coupled directly, by one or more additional control or data buses, or a combination thereof. In alternate embodiments, the CAD server 115 may include fewer or additional components in configurations different from that illustrated in FIG. 3.

The server memory 310 includes read only memory (ROM), random access memory (RAM), other non-transitory computer-readable media, or a combination thereof. The server electronic processor 305 is configured to receive instructions and data from the server memory 310 and execute, among other things, the instructions. In particular, the server electronic processor 305 executes instructions stored in the server memory 310 to perform the methods described herein.

The server network interface 315 sends and receives data to and from the PSAP station computing devices 110 and the communication network 135. In some embodiments, the server network interface 315 includes one or more transceivers for wirelessly communicating with PSAP station computing device 110 and the communication network 135. Alternatively or in addition, the server network interface 315 may include connectors or ports for receiving wired connections to the PSAP station computing devices 110 and the communication network 135, such as Ethernet cables.

The ECH server 130 includes components or combinations of different components, including all or some of the various components described above with respect to the CAD server 115 (for example, an electronic processor, memory, and a network interface). As a consequence, these components are not described in detail or explicitly illustrated.

Figure 4A:
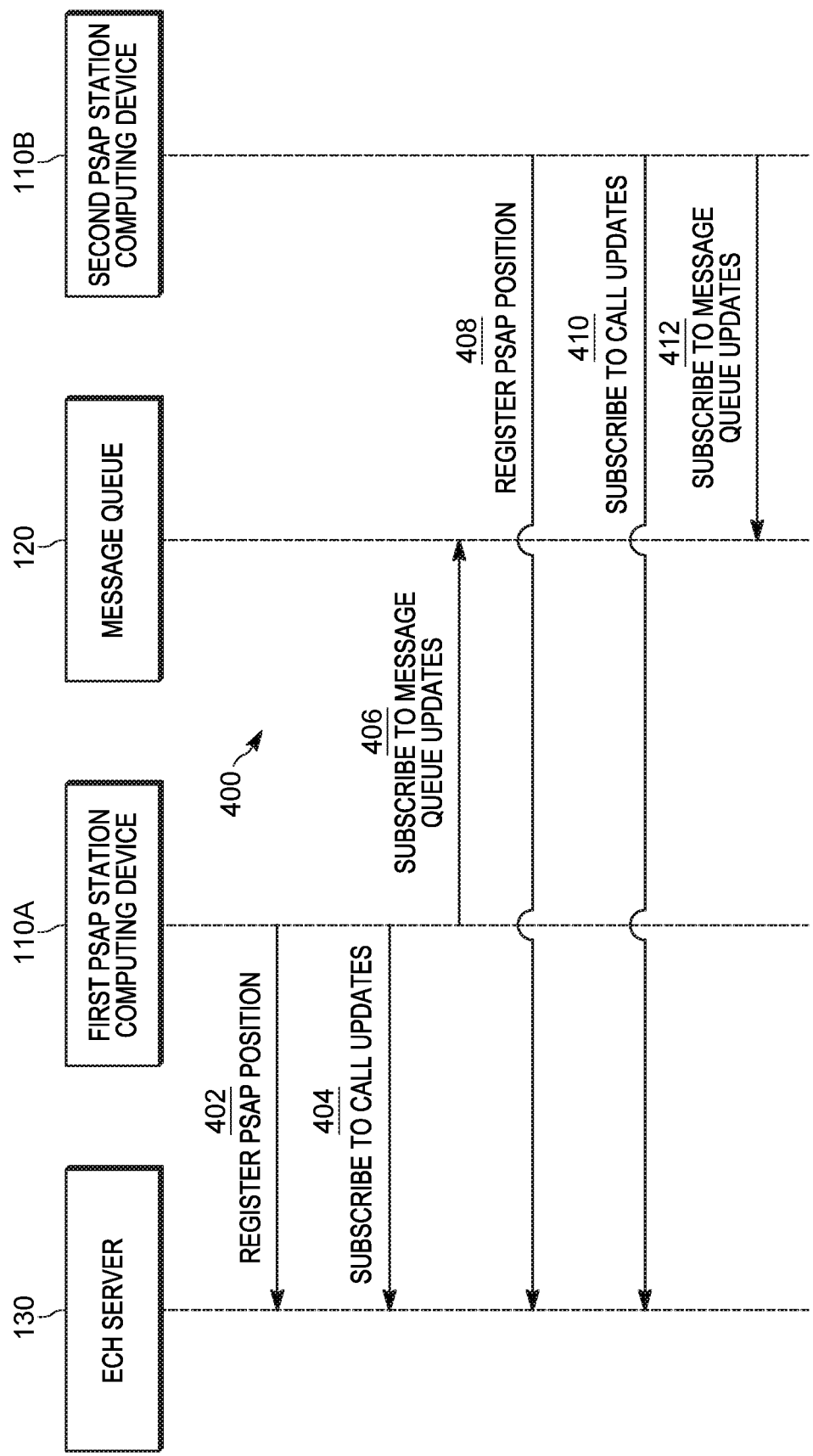
FIG. 4A is a sequence diagram of a portion of a method for transferring CAD data between PSAP station computing devices as a result of a detected successful call transfer, in accordance with some embodiments.
Figure 4B:
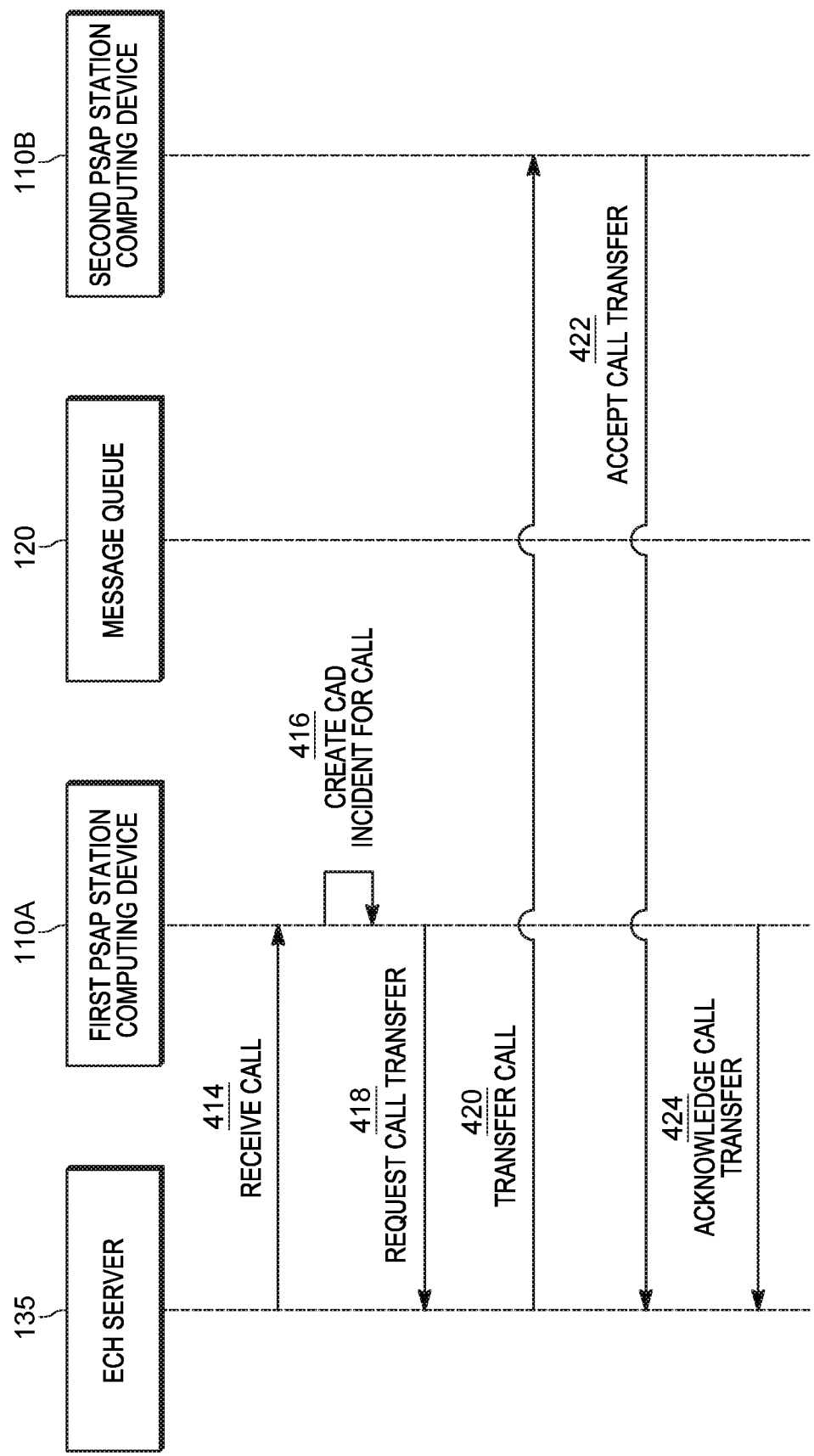
FIG. 4B is a sequence diagram of another portion of the method for transferring CAD data included in FIG. 4A.
Figure 4C:
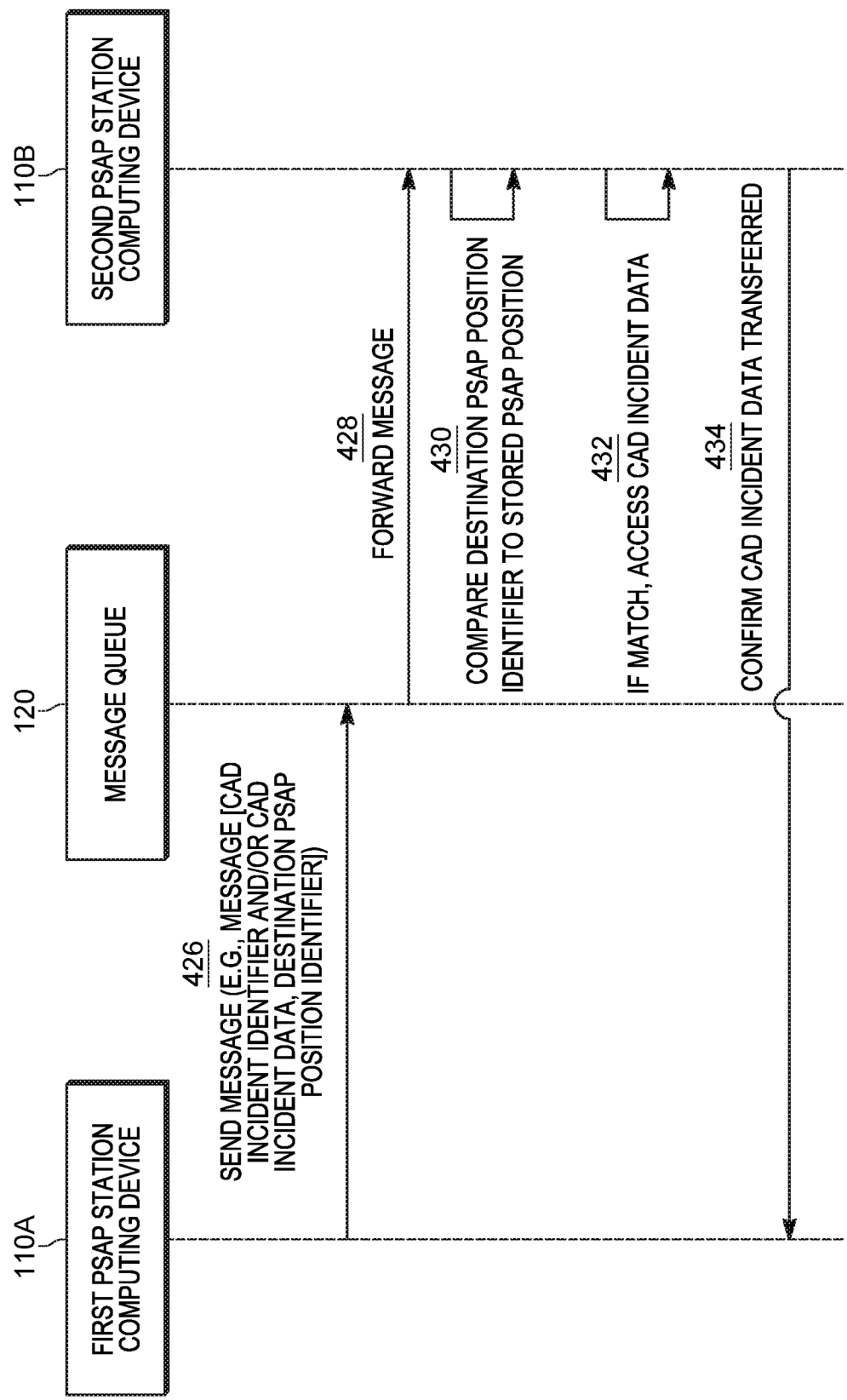
FIG. 4C is a sequence diagram of another portion of the method for transferring CAD data included in FIGS. 4A and 4B.

As described above, when a first user transfers an emergency call to a second user, the first user needs to save the corresponding CAD incident data in an on-premises CAD database (e.g., CAD incident database 125). Upon accepting the transferred emergency call, the second user must manually locate the CAD incident data in the on-premises CAD database. FIGS. 4A, 4B, and 4C illustrate one example of a method 400 for transferring CAD incident data between PSAP station computing devices 110 as a result of a detected successful call transfer at the ECH server 130. For ease of description and understanding, the method 400 described below is described in terms of transferring CAD incident data from a first PSAP station computing device 110A to a second PSAP station computing device 110B. While a particular order of processing steps, message receptions, and/or message transmissions is indicated in FIGS. 4A, 4B, and 4C as an example, timing and ordering of such steps, receptions, and transmissions may vary where appropriate without negating the purpose and advantages of the examples set forth in detail throughout the remainder of this disclosure.

At step 402 in FIG. 4A, the first PSAP station computing device 110A registers a PSAP position of the first PSAP station computing device 110A with the ECH server 130. This registration may be part of a login process to the ECH server 130 or a separate process. In some embodiments, the first PSAP station computing device 110A registers its PSAP position (an example of a "first PSAP position") by sending, to the ECH server 130, an identifier identifying the PSAP position of the first PSAP station computing device 110A at the PSAP 105 (an example of a "first identifier"). At step 404, the first PSAP station computing device 110A subscribes to call updates from the ECH server 130. At step 406, the first PSAP station computing device 110A subscribes to message queue updates from the message queue 120. For example, the first PSAP station computing device 110A may send a subscription request to receive notifications of messages added to the message queue 120.

At step 408, the second PSAP station computing device 110B registers a PSAP position of the second PSAP station computing device 110B with the ECH server 130. In some embodiments, the second PSAP station computing device 110B registers its PSAP position (an example of a "second PSAP position") by sending, to the ECH server 130, an identifier identifying the PSAP position of the second PSAP station computing device 110B at the PSAP 105 (an example of a "second identifier"). At step 410, the second PSAP station computing device 110B subscribes to call updates from the ECH server 130. At step 412, the second PSAP station computing device 110B subscribes to message queue updates from the message queue 120. For example, the second PSAP station computing device 110B may send a subscription request to receive notifications of messages added to the message queue 120.

At step 414 in FIG. 4B, the first PSAP station computing device 110A receives a call from the ECH server 130. The call, for example, is an emergency call that a civilian places by dialing 9-1-1 on a communication device (e.g., a smart phone). At step 416, a CAD incident is created for the call at the first PSAP station computing device 110A. For example, the first PSAP station computing device 110A receives user-entered CAD incident data associated with the call and creates a CAD incident including, among other things, the user-entered CAD incident data.

At step 418, the first PSAP station computing device 110A sends a request to the ECH server 130 to transfer the call to another PSAP position at the PSAP 105. In some embodiments, the call transfer request identifies a specific PSAP position at the PSAP 105 for the ECH server 130 to transfer the call to. For example, the call transfer request (an example of a "first request") may include an identifier identifying the PSAP position of the second PSAP station computing device 110B at the PSAP 105. In alternate embodiments, the call transfer request may not identify a specific PSAP position at the PSAP 105, and the ECH server 130 determines which PSAP position at the PSAP 105 to transfer the call to. For example, the ECH server 130 may identify and select to transfer the call to a PSAP position of a PSAP station computing device 110 that is available to receive the call transfer. In some embodiments, the first PSAP station computing device 110A sends the call transfer request responsive to receiving a user-entered request to transfer the call from a user at the first PSAP station computing device 110A (an example of a "first user").

At step 420, the ECH server 130 transfers the call. In the embodiment illustrated, the ECH server 130 transfers the call to the second PSAP station computing device 110B. At step 422, the second PSAP station computing device 110B accepts the call transfer from the ECH server 130. For example, the second PSAP station computing device 110B may send a signal to the ECH server 130 indicating an acceptance of the call transfer. At step 424, the ECH server 130 sends an acknowledgment to the first PSAP station computing device 110A of the successful call transfer to the second PSAP station computing device 110B. In some embodiments in which the ECH server 130 selects which PSAP position at the PSAP 105 to transfer the call to, the acknowledgement of the successful call transfer sent from the ECH server 130 to the first PSAP station computing device 110A includes an identifier identifying the PSAP position of the PSAP station computing device 110 at the PSAP 105 which the call was transferred to. For example, if the ECH server 130 selects to the transfer the call to the second PSAP station computing device 110B, the acknowledgement of the successful call transfer may include the identifier identifying the PSAP position of the second PSAP station computing device 110B at the PSAP 105.

At step 426 in FIG. 4C, the first PSAP station computing device 110A sends a message to the message queue 120. The message is a request for the message queue 120 to provide the CAD incident data to the PSAP station computing device 110 which the call was transferred to. The message includes a destination PSAP position identifier identifying the PSAP position of the PSAP station computing device 110 at the PSAP 105 which the call was transferred to. For example, when the call is transferred to the second PSAP station computing device 110B, the destination PSAP position identifier would be the identifier identifying the PSAP position of the second PSAP station computing device 110B. In some embodiments, the message also includes a CAD incident identifier identifying the CAD incident. Alternatively or in addition, the message also includes the CAD incident data. At step 428, the message queue 120 forwards the message to the plurality of PSAP station computing devices 110 (including the second PSAP station computing device 110B). For example, the message queue 120 forwards the destination PSAP position identifier as well as the CAD incident identifier and/or the CAD incident data to the second PSAP station computing device 110B. In some embodiments, the message queue 120 forwards the message only to PSAP station computing devices 110 that have previously subscribed to receive message queue updates from the message queue 120.

At step 430, the second PSAP station computing device 110B compares the destination PSAP position identifier in the forwarded message to an identifier identifying the PSAP position of the second PSAP station computing device 110B at the PSAP 105 (an example of a "corresponding identifier"). In some embodiments, the identifier identifying the PSAP position of the second PSAP station computing device 110B at the PSAP 105 is stored in a memory of the second PSAP station computing device 110B (e.g., stored in station memory 210). At step 432, if the destination PSAP position identifier in the forwarded message matches the identifier identifying the PSAP position of the second PSAP station computing device 110B at the PSAP 105, the second PSAP station computing device 110B accesses the CAD incident data. Although not illustrated, if the destination PSAP position identifier in the forwarded message does not match the identifier identifying the PSAP position of the second PSAP station computing device 110B at the PSAP 105, the second PSAP station computing device 110B determines that it is not the intended recipient of the forwarded message, and thus does not access the CAD incident data. In some embodiments, prior to sending the message to the message queue 120, the first PSAP station computing device 110A stores the CAD incident data in the CAD incident database 125. In such embodiments, the second PSAP station computing device 110B uses the CAD incident identifier in the forwarded message to access the CAD incident data from the CAD incident database 125. In alternate embodiments, the first PSAP station computing device 110A includes the CAD incident data in the message to the message queue 120, and the second PSAP station computing device 110B accesses the CAD incident data from the forwarded message. In some embodiments, the second PSAP station computing device 110B provides the CAD incident data to a user at the second PSAP station computing device 110B (an example of a "second user") by displaying the CAD incident data on the display 220.

At step 434, the second PSAP station computing device 110B confirms to the first PSAP station computing device 110A that the CAD incident data has been transferred. For example, the second PSAP station computing device 110B may send a confirmation to the first PSAP station computing device 110A indicating that the CAD incident data has been transferred. In some embodiments, the confirmation also indicates that the second PSAP station computing device 110B has provided the CAD incident data to a user at the second PSAP station computing device 110B (for example, by displaying the CAD incident data on the display 220).

Figure 5:
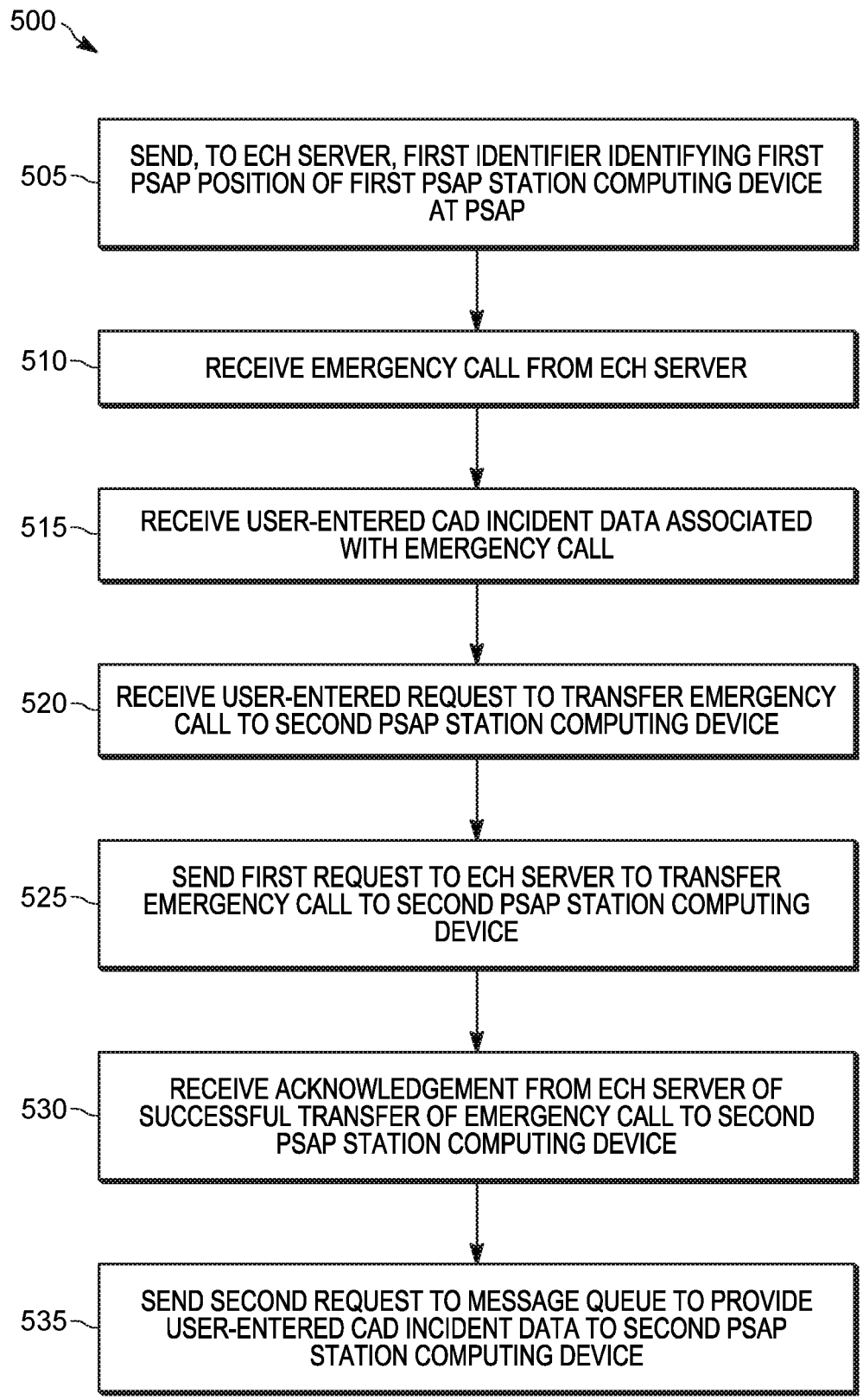
FIG. 5 is a flowchart of a method for transferring CAD data between PSAP station computing devices as a result of a detected successful call transfer, in accordance with some embodiments.

FIG. 5 illustrates a flowchart of an example of a method 500 performed by the first PSAP station computing device 110A for transferring CAD data between PSAP station computing devices 110 as a result of a detected successful call transfer. The method 500 described below includes portions of the method 400 described above. At block 505, the first PSAP station computing device 110A sends, to the ECH server 130 (an example of a "cloud-based ECH server"), a first identifier identifying a first PSAP position of the first PSAP station computing device 110A at the PSAP 105. At block 510, the first PSAP station computing device 110A receives an emergency call from the ECH server 130. The emergency call, for example, is an emergency call that a civilian places by dialing 9-1-1 on a communication device (e.g., a smart phone). At block 515, the first PSAP station computing device 110A receives user-entered CAD incident data associated with the emergency call.

At block 520, the first PSAP station computing device 110A receives a user-entered request to transfer the emergency call to the second PSAP station computing device 110B. At block 525, the first PSAP station computing device 110A sends a first request to the ECH server 130 to transfer the emergency call to the second PSAP station computing device 110B. The first request includes a second identifier identifying a second PSAP position of the second PSAP station computing device 110B at the PSAP 105. At block 530, the first PSAP station computing device 110A receives an acknowledgement from the ECH server 130 of a successful transfer of the emergency call to the second PSAP station computing device 110B.

At block 535, the first PSAP station computing device 110A sends a second request to the message queue 120 to provide the user-entered CAD incident data to the second PSAP station computing device 110B. The second request includes the second identifier identifying the second PSAP position of the second PSAP station computing device 110B at the PSAP 105. In some embodiments, prior to sending the second request to the message queue 120, the first PSAP station computing device 110A stores the user-entered CAD incident data in the CAD incident database 125. In such embodiments, the second request further includes a CAD incident identifier via which the user-entered CAD incident data can be retrieved from the CAD incident database 125. For example, the second PSAP station computing device 110B may use the CAD incident identifier included in the second request to retrieve the user-entered CAD incident data from the CAD incident database 125. In alternate embodiments, the second request further includes the CAD incident data. In such embodiments, the user-entered CAD incident data is retrieved from the second request itself. For example, the second PSAP station computing device 110B retrieves the user-entered CAD incident data from the second request itself.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment may be implemented as a computer-readable storage medium having computer readable code stored thereon for programming a computer (for example, comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A system for transferring computer aided dispatch (CAD) incident data between public safety answering point (PSAP) station computing devices as a result of a detected successful call transfer at a cloud-based emergency call handling (ECH) server, the system comprising:
 a CAD server located at a PSAP; and
 a plurality of PSAP station computing devices located at the PSAP and including at least a first PSAP station computing device and a second PSAP station computing device, the first PSAP station computing device configured to
  send, to the cloud-based ECH server, a first identifier identifying a first PSAP position of the first PSAP station computing device at the PSAP,
  receive an emergency call from the cloud-based ECH server,
  receive user-entered CAD incident data associated with the emergency call from a first user at the first PSAP station computing device,
  receive a user-entered request to transfer the emergency call to the second PSAP station computing device,
  send, to the cloud-based ECH server, a first request to transfer the emergency call to the second PSAP station computing device, wherein the first request including a second identifier identifying a second PSAP position of the second PSAP station computing device at the PSAP,
  receive, from the cloud-based ECH server, an acknowledgement of a successful transfer of the emergency call to the second PSAP station computing device, and
  send, to a message queue at the CAD server, a second request to provide the user-entered CAD incident data to the second PSAP station computing device, wherein the second request including the second identifier.

2. The system of claim 1, wherein the CAD server is configured to send, from the message queue, the second request to the plurality of PSAP station computing devices.

3. The system of claim 2, wherein the second PSAP station computing device is configured to
 compare the second identifier to a corresponding identifier stored at the second PSAP station computing device, and
 responsive to the second identifier matching the corresponding identifier,
  access the user-entered CAD incident data, and
  provide the user-entered CAD incident data to a second user at the second PSAP station computing device.

4. The system of claim 3, wherein the first PSAP station computing device is further configured to store the user-entered CAD incident data in a CAD incident database at the CAD server prior to sending the second request to the message queue,
 wherein the second request further includes a CAD incident identifier via which the user-entered CAD incident data can be retrieved from the CAD incident database, and
 wherein the second PSAP station computing device is further configured to access the user-entered CAD incident data by using the CAD incident identifier to retrieve the user-entered CAD incident data from the CAD incident database.

5. The system of claim 3, wherein the second request includes the user-entered CAD incident data, and wherein the second PSAP station computing device is further configured to access the user-entered CAD incident data by retrieving the user-entered CAD incident data from the second request.

6. The system of claim 3, wherein the second PSAP station computing device includes a display, and wherein the second PSAP station computing device is further configured to provide the user-entered CAD incident data to the second user by displaying the user-entered CAD incident data with the display.

7. The system of claim 3, wherein the second PSAP station computing device is further configured to
 send a confirmation to the first PSAP station computing device that the user-entered CAD incident data was provided to the second user.

8. The system of claim 1, wherein the second PSAP station computing device is further configured to prior to receiving the second request from the message queue, send a subscription request to the CAD server to receive notifications of messages added to the message queue.

9. A method for transferring computer aided dispatch (CAD) incident data between public safety answering point (PSAP) station computing devices as a result of a detected successful call transfer at a cloud-based emergency call handling (ECH) server, the method comprising:
sending, to the cloud-based ECH server from a first PSAP station computing device located at a PSAP, a first identifier identifying a first PSAP position of the first PSAP station computing device at the PSAP;
receiving an emergency call at the first PSAP station computing device from the cloud-based ECH server;
receiving user-entered CAD incident data associated with the emergency call at the first PSAP station computing device from a first user;
receiving, at the first PSAP station computing device, a user-entered request to transfer the emergency call to a second PSAP station computing device located at the PSAP;
sending, to the cloud-based ECH server from the first PSAP station computing device, a first request to transfer the emergency call to the second PSAP station computing device, wherein the first request including a second identifier identifying a second PSAP position of the second PSAP station computing device at the PSAP;
receiving, at the first PSAP station computing device from the cloud-based ECH server, an acknowledgement of a successful transfer of the emergency call to the second PSAP station computing device; and
sending, to a message queue at a CAD server located at the PSAP from the first PSAP station computing device, a second request to provide the user-entered CAD incident data to the second PSAP station computing device, wherein the second request including the second identifier.

10. The method of claim 9, further comprising
sending, by the CAD server from the message queue, the second request to a plurality of PSAP station computing devices located at the PSAP including the second PSAP station computing device.

11. The method of claim 10, further comprising
comparing, by the second PSAP station computing device, the second identifier to a corresponding identifier stored at the second PSAP station computing device; and
responsive to the second identifier matching the corresponding identifier,
accessing, by the second PSAP station computing device, the user-entered CAD incident data, and
providing, by the second PSAP station computing device, the user-entered CAD incident data to a second user.

12. The method of claim 11, further comprising prior to sending the second request to the message queue, storing, by the first PSAP station computing device, the user-entered CAD incident data in a CAD incident database at the CAD server,
wherein the second request further includes a CAD incident identifier via which the user-entered CAD incident data can be retrieved from the CAD incident database, and
wherein the second PSAP station computing device accessing the user-entered CAD incident data comprises the second PSAP station computing device using the CAD incident identifier to retrieve the user-entered CAD incident data from the CAD incident database.

13. The method of claim 11, wherein the second request includes the user-entered CAD incident data, and wherein the second PSAP station computing device accessing the user-entered CAD incident data comprises the second PSAP station computing device retrieving the user-entered CAD incident data from the second request.

14. The method of claim 11, wherein the second PSAP station computing device providing the user-entered CAD incident data to the second user comprises the second PSAP station computing device displaying the user-entered CAD incident data on a display of the second PSAP station computing device.

15. The method of claim 11, further comprising
sending, to the first PSAP station computing device from the second PSAP station computing device, a confirmation that the user-entered CAD incident data was provided to the second user.

16. The method of claim 9, further comprising
prior to receiving the second request at the second PSAP station computing device, sending, to the CAD server from the second PSAP station computing device, a subscription request to receive notifications of messages added to the message queue.

17. A non-transitory computer-readable medium for use in connection with transferring computer aided dispatch (CAD) incident data between public safety answering point (PSAP) station computing devices as a result of a detected successful call transfer at a cloud-based emergency call handling (ECH) server, the non-transitory computer-readable medium comprising instructions that when executed by a first PSAP station computing device located at a PSAP cause the first PSAP station computing device to send, to the cloud-based ECH server, a first identifier identifying a first PSAP position of the first PSAP station computing device at the PSAP;
receive an emergency call from the cloud-based ECH server;
receive user-entered CAD incident data associated with the emergency call;
receive a user-entered request to transfer the emergency call to a second PSAP station computing device located at the PSAP;
send, to the cloud-based ECH server, a first request to transfer the emergency call to the second PSAP station computing device, wherein the first request including a second identifier identifying a second PSAP position of the second PSAP station computing device at the PSAP;
receive, from the cloud-based ECH server, an acknowledgement of a successful transfer of the emergency call to the second PSAP station computing device; and
send, to a message queue at a CAD server located at the PSAP, a second request to provide the user-entered CAD incident data to the second PSAP station computing device, wherein the second request including the second identifier.

18. The non-transitory computer-readable medium of claim 17, wherein the instructions further cause the first PSAP station computing device to store the user-entered CAD incident data in a CAD incident database at the CAD server prior to sending the second request to the message queue, and wherein the second request further includes a CAD incident identifier via which the user-entered CAD incident data can be retrieved from the CAD incident database.

19. The non-transitory computer-readable medium of claim 17, wherein the second request further includes the user-entered CAD incident data.

* * * * *